United States Patent [19]

Reichert et al.

[11] Patent Number: 5,721,182
[45] Date of Patent: Feb. 24, 1998

[54] METAL NIOBATES AND/OR TANTALATES, THEIR PREPARATION AND PEROVSKITES FORMED FROM THEM

[75] Inventors: Karlheinz Reichert, Hornburg; Falko Schlenkrich, Dresden, both of Germany

[73] Assignee: H.C. Starck, GmbH & Co KG, Goslar, Germany

[21] Appl. No.: 535,847

[22] Filed: Sep. 28, 1995

[30] Foreign Application Priority Data

Oct. 12, 1994 [DE] Germany .................. 44 36 392.3

[51] Int. Cl.$^6$ .................................................. C04B 35/00
[52] U.S. Cl. .................................... 501/134; 501/135
[58] Field of Search .................................... 501/134, 135; 252/629

[56] References Cited

U.S. PATENT DOCUMENTS

| | | | |
|---|---|---|---|
| 3,607,752 | 9/1971 | Graenicher | 252/62.9 |
| 4,287,075 | 9/1981 | Fujiwara et al. | 501/135 |
| 4,550,088 | 10/1985 | Park et al. | 501/135 |
| 5,011,803 | 4/1991 | Park et al. | 501/134 |
| 5,037,784 | 8/1991 | Raveau et al. | 501/134 |
| 5,051,280 | 9/1991 | Hung | 427/226 |
| 5,164,882 | 11/1992 | Kanai et al. | 501/136 |
| 5,180,699 | 1/1993 | Terada et al. | 501/134 |
| 5,366,718 | 11/1994 | Sato et al. | 501/134 |
| 5,461,014 | 10/1995 | Chu et al. | 501/135 |

FOREIGN PATENT DOCUMENTS

| | | | |
|---|---|---|---|
| 0294991A2 | 6/1988 | European Pat. Off. | C01B 13/18 |
| 4217817C2 | 5/1992 | Germany | C04B 35/00 |

OTHER PUBLICATIONS

Patent Abstracts of Japan, C-721 May 23, 1990, vol. 14., No. 242.

Applied Physics Letters, 1 Mar. 1967, W.A. Bonner et al, pp. 163–165.

J. Am. Ceram. Soc., May 1988, 71[5] C–250–251, Harold S. Horowitz.

J. Am. Ceram. Soc., vol. 67, No. 3, 1992, pp. 311–315, S.L. Swartz et al.

J. Am. Ceram. Soc. vol. 72 No. 8, pp. 1333–1337, Young-Wook Kim et al. 1989.

Advances in Ceramics, vol. 21, 1987, Univ. Missouri–Rolla, H.U. Anderson et al. the American Ceramic Society, Inc.

Advances in Ceramics, vol. 21, 1987, The Pennsylvania State Univ., D.@W. Sproson and G.L. Messing.

Materials Research Laboratory, pp. 182–189, *Sol–Gel Processing of Lead Magnesium Niobate (PMN) Powder and Its Characterization*, P. Ravindranathan et al.

Materials Research Laboratory, pp. 137–144. *Dielectric Properties of Sol–Gel Derived Lead Magnesium Niobate Ceramics*, P. Ravindranathan et al.

J. Mater. Res. vol. 5, No. 12, Dec. 1990, pp. 2902–2909, P. Papet et al.

*Primary Examiner*—Deborah Jones
*Attorney, Agent, or Firm*—Jerry Cohen

[57] ABSTRACT

Highly reactive metal niobates and/or metal tantalates of the general formula $Me(II)A_2O_6$ or $Me(III)AO_4$, a method for the preparation thereof, their further processing to form perovskites of the general formula $X(B'B'')O_3$ wherein X signifies Pb and/or Ba, B' signifies Mg, Fe, Co, Ni, Cr, Mn, Cd, Ti, Zr and/or Zn and B" signifies Nb and/or Ta, as well as these perovskites are provided through the present invention. An additive of Li, Na and/or K is provided to the niobates/tantalates in 0.1 to 20 mol-%.

14 Claims, No Drawings

METAL NIOBATES AND/OR TANTALATES, THEIR PREPARATION AND PEROVSKITES FORMED FROM THEM

BACKGROUND OF THE INVENTION

The present invention relates to highly reactive metal niobates and/or metal tantalates of the general formula Me(II)A$_2$O$_6$ or Me(III)AO$_4$, wherein XA signifies Nb and/or Ta and Me(II) signifies Mg, Fe, Co, Ni, Cr, Mn, Cd and/or Zn of valence II and Me(III) signifies Fe, Co, Cr and/or Mn of valence III, a method for the preparation thereof, their further processing to form perovskites of the general formula X(B'B")O$_3$ wherein X signifies Pb and/or Ba, B' signifies Mg, Fe, Co, Ni, Cr, Mn, Cd, Ti, Zr and/or Zn and B" signifies Nb and/or Ta, as well as these perovskites.

The uses of metal niobates and/or metal tantalates include serving as starting materials for the preparation of complex perovskites, which are employed as materials in electroceramics. Owing to their high dielectric constant, their large electrostrictive coefficient and their extremely high quality—especially in the case of the tantalates—lead metal niobates or barium metal niobates and/or tantalates play increasingly important roles in electroceramics, including the roles of being essential materials for the production of ceramic capacitors, electrostrictive ceramics (actuators), piezoceramics and microwave ceramics (for example, resonators). Such compounds having a perovskite structure correspond to the general formula X(B'B")O$_3$ wherein X signifies Ba and Pb, B' signifies Mg, Fe, Co, Ni, Cr, Mn, Cd, Cu, Zn and B" signifies Nb and Ta (Appl. Phys. Lett., 10 (5), 163–165 (1967).

Several methods are known for the preparation of complex ferroelectric perovskites containing a transition metal of the group VB (Ta and Nb).

Mixing of the oxides, with a subsequent solid-state reaction at very high calcination temperatures, is known from J. Amer. Ceram. Soc. 71 (5), C-250 to C-251 (1988). Using this ceramic method it is extremely difficult to prepare pure-phase perovskites containing more than 80% of the perovskite phase. In the course of this solid-state reaction there inevitably appears a stable pyrochlore phase, which significantly impairs the properties of the resulting electroceramics.

J. Ceram. Soc. 67 (5) 311–314 (1984) discloses a preliminary reaction of Nb$_2$O$_5$ together with, for example, MgO in a solid-state reaction, with an almost pure-phase perovskite being obtained in the subsequent reaction with PbO, which proceeds according to the formulae

Nb$_2$O$_5$+MgO→MgNb$_2$O$_6$ (columbite)   (I)

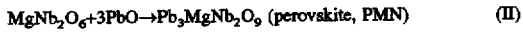

MgNb$_2$O$_6$+3PbO→Pb$_3$MgNb$_2$O$_9$ (perovskite, PMN)   (II)

Owing to the elevated temperatures in the preliminary reaction to form columbite, at 1,000° C. only a moderately reactive magnesium niobate is obtained, however, from the above-mentioned mixed oxides, so that the subsequent reaction with PbO is successful only at higher temperatures (greater than 800° C.). In the course of the further processing this ceramically prepared perovskite powder can only be sintered at higher temperatures. Here sintering temperatures of at least 1,200° C. are necessary in order simultaneously to obtain good dielectric properties.

Wet chemical methods have proved to be of advantage for the preparation of perovskites. Thus in J. Am. Ceram. Soc. 72 (8), 1335–1357 (1989) the hydrolysis of an alkoxide mixture is described, and coprecipitation from an alcoholic oxalic acid solution is described in published European patent application 294 991. The calcination of a gel previously prepared from NbCl$_5$ or Nb(OR)$_5$ and metal salts by addition of H$_2$O$_2$ and citric acid is known from Advances in Ceramics, Vol. 21, 91–98 (1987). As a rule wet chemical methods give rise to very reactive intermediate products, which react to form the desired perovskite even at low temperatures. Moreover the sintering properties of these very fine powders are also significantly improved compared with those of the ceramically prepared powders. But in order to also obtain high dielectric constants in these powders prepared by wet chemical methods, sintering has to be carried out at elevated temperatures of above 1,000° C. These wet chemical methods are moreover very uneconomic. Thus, for example, the alkoxide method has the disadvantage that the preparation and handling of the starting materials is very difficult.

In order to obtain materials which sinter at lower temperatures (but still 1,000° C.) and at the same time have a very high dielectric constant at room temperature, a series of formulations was developed which, in addition to the essential material PMN, contain various other compounds concomitantly. Thus in U.S. Pat. No. 4,287,075 there is described a formulation consisting of lead iron niobate, lead magnesium niobate and lead magnesium tungstate, but with further additives such as lead manganese niobate, lithium oxide, chromium oxide and/or cerium oxide being necessary. Published Japanese patent application 57-208004 describes a composition consisting of lead magnesium niobate, cadmium titanate, lead iron tungstate together with additives of manganese oxide, cerium oxide, chromium oxide and/or cobalt oxide. According to U.S. Pat. No. 5,011,803, lead iron niobate and lead iron tungstate are also used in addition to lead magnesium niobate, as well as further additives such as cadmium oxide, titanium oxide, cerium oxide and/or manganese oxide. A further 2% of sintering agents are added to this total mass. All the above-mentioned materials are ceramic compositions wherein the essential material PMN is present in a quantity of less than 95% by weight.

Additives such as other perovskite compounds, doping agents and/or sintering agents to a greater or lesser extent alter the properties of pure perovskite compounds such as lead magnesium niobate or barium magnesium tantalate. Thus, for example, the above-mentioned additives can drastically alter the Curie temperature and therewith the operating temperature of the materials. Compounds such as lead iron niobate lead to a lowering of the insulation resistance, while lead magnesium tungstate and sintering agents lower the dielectric constant. At the same time foreign phases may still appear in addition to the desired perovskites. The greater the number of additives supplied to the pure perovskite system, the more arduous or the greater becomes the expenditure of resources in order to obtain homogeneous mixtures of substates. All this generally leads to a deterioration in the dielectric properties, so that the potential properties of the pure materials are not fully utilised.

The object of the present invention is therefore the provision of highly reactive metal niobates and/or metal tantalates, which can be further processed to form low-sintering ceramics having good dielectric properties.

SUMMARY OF THE INVENTION

Products were then found which satisfy all these requirements. They are highly reactive metal niobates and/or metal tantalates of the general composition Me(II)A$_2$O$_6$ or Me(III)

AO$_4$, wherein A signifies Nb or Ta and Me(II) signifies Mg, Fe, Co, Ni, Cr, Mn, Cd and/or Zn of chemical valence II and Me(III) signifies Fe, Co, Cr and/or Mn of chemical valence III. These products contain an additive of Li, Na and/or K, with the proportion of the additive being from 0.1 to 20 mol-%. In the case of magnesium niobate, the additive consists preferably of lithium niobate.

To date there are no powders known from the literature which achieve such high conversions to perovskite at such low temperatures. See Table 2. The reactivity of the powder according to the invention is consequently superior even to that of powders prepared by wet chemical methods.

TABLE 1

| Preparation of PMN (Lead Magnesium Niobate) | | % Perovskite proportion after calcining at | | | | | |
|---|---|---|---|---|---|---|---|
| Composition | Method | 600° C. | 650° C. | 700° C. | 800° C. | 900° C. | 1000° C. |
| P + M + N* | Direct synthesis (I); prior art | — | — | — | 68.4 | 74 | 76.3 |
| P + M + N* | Sol gel (2) prior art | — | — | 9 | 98 | — | — |
| P + M + N | Sol gel (3) prior art | ~45 | ~60 | ~80 | ~95 | ~98 | — |
| P + MN* | Columbite (1) present invention | | | | 98.9 | 98.5 | 98.2 |
| P + MN** | present invention | 3.4 | 90 | 94 | 99 | — | — |

The present invention also provides a method for the preparation of the products according to the invention. This is a method for the preparation of the metal niobates and/or metal tantalates by wet mixing of the corresponding metal oxides together with niobium constituents and/or tantalum constituents, drying and calcining, with the niobium constituents and/or tantalum constituents being used in the form of hydrated niobium oxide and/or hydrated tantalum oxide.

The additives can be introduced prior to and/or during the wet mixing. The Li, Na and/or K used in this connection are added preferably in the form of their respective salts, hydroxides and/or oxides, singly or mixed. The addition of lithium niobate and/or lithium tantalate has proved to be particularly advantageous, with the lithium being added in the form of a salt, hydroxide and/or oxide and the niobium constituent and/or tantalum constituent being added in the form of hydrated niobium oxide and/or hydrated tantalum oxide.

Using the method described above, homogeneous mixtures of substances, wherein the doping agent is also very homogeneously distributed, can be prepared very easily by means of a mixer, without a grinding process. Wet mixing can be carried out particularly usefully for a period ranging from 5 minutes to 90 minutes. When the metal constituents and the doping agents are used in the form of carbonates, bicarbonates, hydroxides and/or oxides, the end product is not contaminated by additional interfering anions. The dried mixtures of substances are calcined for from 15 minutes to 6 hours at temperatures of from 400° C. to 1,200° C., preferably from 500° C. to 1,000° C.

This invention also provides the further processing of the metal niobates and/or metal tantalates to form perovskites of the general formula X(B'B")O$_3$ wherein X signifies Pb and/or Ba, B' signifies Mg, Fe, Co, Ni, Cr, Mn, Cd, Ti, Zr and/or Zn and B" signifies Nb and/or Ta.

Surprisingly, it has been found the doped metal niobates and/or metal tantalates according to the invention can be reacted with a lead constituent even at very low temperatures. Thus, for example, a magnesium niobate to which Li, Na and/or K has been added, after being mixed with a lead constituent (PbO or Pb$_3$O$_4$), already reacts at 600° C. to form the desired perovskite. The proportion of the perovskite phase is already 90% at a calcination temperature of 650° C.

Calcination time: * 4 h or more, ** 2 h

P=lead,

M=magnesium

N=niobium

MN=magnesium niobate (1) J. Am. Ceram. Soc., 67 (5) 311–315 (1984)

(2) Ceram. Trans. 1, 182–189 (1988)

(3) Advances in Ceramics, 21, 91–98 (1987)

Owing to the low calcination temperatures the perovskites obtained have exceptionally fine particles, so that they can be further processed directly. In all the other methods known hitherto, the perovskite powders are ground up for some time prior to being further processed into ceramics. In the course of this the powders are recontaminated with foreign matter which in turn impairs the sintering and dielectric properties.

Surprisingly, the high reactivity of the metal niobates and/or metal tantalates according to the invention is also transferred to the perovskite powder obtained after the reaction. Thus, for example, lead magnesium niobates can be sintered at extremely low temperatures to form dense ceramics. Densities of more than 95% are already achieved at 850° C./2 hours. Amazingly, the dielectric constants of PMN ceramics are very high at these extremely low sintering temperatures. At a measuring frequency of 100 kHz, for example, values for dielectric constants of above 9,000 at 25° C. are obtained in PMN ceramics sintered at 850° C.

Active sintered powder can also be prepared by sol-gel processes. However, the ceramics prepared by sol-gel processes exhibit acceptable dielectric properties only at sintering temperatures of greater than 1,000° C. The dielectric properties can be improved by sintering the sol-gel powders under pressure. But these powders are in no way comparable with the powders according to the invention as regards the dielectric properties. For the first time active sintered lead perovskite powders are thus available which contain more than 95%, preferably 98%, of the essential constituent and already sinter to form dense ceramics having exceptionally good dielectric properties at temperatures definitely below 1,000° C. (see Tables 2 to 5).

TABLE 2

| Composition | Method | Dielectric constant max. | Sintering conditions | Measuring frequency |
|---|---|---|---|---|
| PMN | Columbite (1) | 14000 | 1270° C. | 100 kHz |
| PMN | Columbite (1) | 15900 | 1270° C. | 100 kHz |
| PMN | Columbite (1) | 18200 | 1270° C. | 100 kHz |
| PMN | Columbite (1) | 16400 | 1300° C. | 100 kHz |
| PMN Single crystal | | 15900 | | 60 kHz |
| PMN | Sol gel (4) | 2992 | 900° C. | 1 kHz |
| PMN | Sol gel (4) | 9369 | 1000° C. | 1 kHz |
| PMN | Sol gel (4) | 14550 | 1100° C. | 1 kHz |
| PMN | Sol gel (4) | 15374 | 1200° C. | 1 kHz |
| PMN | Sol gel (4) | 15885 | 1250° C. | 1 kHz |
| PMN (5) | Hot-pressed 25 MPa | 6400 | 825° C. | 1 kHz |
| PMN (5) | Hot-pressed 18 MPa | 11200 | 890° C. | 1 kHz |
| PMN | (5) | 11200 | 900° C. | 1 kHz |
| PMN | (5) | 15400 | 950° C. | 1 kHz |
| PMN | (5) | 16600 | 1050° C. | 1 kHz |

(1) J. Am. Ceram. Soc., 67, 311–315 (1984)
(4) Ferroelectrics Letters, 11, 137–144 (1990)
(5) J. Mater. Res., 5, 2902–2909 (1990)

The invention is explained below by means of Examples, without any limitation being intended.

EXAMPLE 1

8 kg of hydrated niobium oxide, moist from filtering, having an Nb content of 24.4%, was diluted with 3 l of water and to this was added 980 g of magnesium carbonate hydroxide. This suspension was homogenized for 15 minutes in a Thyssen-Henschel mixer operating at 2,000 rev/min. The paste obtained was separated out. Part of the paste was homogenized for a further 15 minutes. To another part was added 0.5% by weight, referred to the calcined end product, of a metal constituent and the mixture was also homogenized for a further 15 minutes in the Thyssen-Henschel mixer. The concentrated mixtures of substances—doped and undoped—were dried at 105° C. and then calcined at 1,000° C. for 2 hours. The corresponding stoichiometric quantity of $Pb_3O_4$ was then added to the magnesium niobates and the mixture was homogenized for 2 hours in a ball mill, with the addition of water.

After being dried at 105° C., the mixtures were calcined at different temperatures. By means of X-ray diffraction analyses it could be established that the desired perovskite already forms at 600° C. At 650° C./2 hours the proportion of perovskite is already 90% (see Table 1), irrespective of which additive has been selected.

The perovskites obtained at 800° C. were pressed to form pellets (diameter 10 mm/depth 1.5 mm) and sintered for 2 hours under standard atmospheric conditions at different temperatures. The dielectric properties of these ceramics were measured. For all the sintered samples the dielectric loss factor tan δ was below than $200 \cdot 10^{-1}$. The Curie temperatures for all the experiments conducted here were comparable. The dielectric constants are shown in the following tables

TABLE 3

Dielectric properties of PMN— and $Li_2O$—PMN ceramics (addition 10 mol-%)

| Sintering conditions | Dielectric constant 25° C. PMN | Density [g/cm³] PMN | Dielectric constant 25° C. PMN + $Li_2O$ | Density [g/cm³] PMN + $Li_2O$ |
|---|---|---|---|---|
| 2 h/850 | | Porous | 8 621 | 7.7 |
| 2 h/1 000 | 7 271 | 8.02 | 9 524 | 7.8 |
| 2 h/1 200 | 9 946 | 7.96 | 8 206 | 7.5 |

Theoretical density of PMN: 8.12 g/cm²

TABLE 4

Dielectric properties of PMN— and $LiNbO_3$—PMN ceramics (addition 0.5 mol-%)

| Sintering conditions | Dielectric constant 25° C. PMN | Density [g/cm³] PMN | Dielectric constant 25° C. PM + LN | Density [g/cm³] PMN + LN |
|---|---|---|---|---|
| 2 h/850 | | Porous | 12 461 | 7.9 |
| 2 h/900 | | Porous | 12 942 | 7.91 |
| 2 h/1 000 | 8 665 | 8.0 | 13 255 | 7.96 |
| 2 h/1 100 | 11 251 | 8.0 | 12 880 | 7.95 |
| 2 h/1 200 | 11 194 | 7.88 | 11 807 | 7.83 |

Theoretical density of PMN: 8.12 g/cm²

TABLE 5

Dielectric properties of PMN— and $K_2O$—PMN ceramics (addition 2 mol-%)

| Sintering conditions | Dielectric constant 25° C. PMN | Density [g/cm³] PMN | Dielectric constant 25° C. PMN + $K_2O$ | Density [g/cm³] PMN + $K_2O$ |
|---|---|---|---|---|
| 2 h/850 | | undicht | 8 955 | 7.88 |
| 2 h/1 000 | 9 404 | 7.93 | 9 632 | 7.91 |
| 2 h/1 200 | 11 865 | 7.90 | 8 893 | 7.73 |

Theoretical density of PMN: 8.12 g/cm²

We claim:

1. Metal niobates of the general composition Me(II) $Nb_2O_6$ or Me(III)$NbO_4$ where Me(II) signifies a valence (II) metal selected from the group consisting of Mg, Fe, Co, Ni, Cr, Mn, Cd and Zn and Me(III) signifies a valence III metal selected from the group consisting of Fe, Co, Cr and Mn, and further containing from 0.1 to 20 mol-% of additive comprising a material selected from the group consisting of Li, Na and K.

2. Metal niobates according to claim 1, wherein the niobate is magnesium niobate and the additive material is lithium niobate.

3. Metal tantalates of the general composition Me(II) $Ta_2O_6$ or Me(III)$TaO_4$ and Me(II) signifies a valence (II) metal selected from the group consisting of Mg, Fe, Co, Ni, Cr, Mn, Cd and Zn and Me(III) signifies a valence III metal selected from the group consisting of Fe, Co, Cr and Mn, and further containing from 0.1 to 20 mol-% of additive comprising a material selected from the group consisting of Li, Na and K.

4. Method for the preparation of the niobates and tantalates of claims 1, 2, or 3 comprising the steps of:
   (a) wet mixing a tantalum or niobium constituent, a corresponding metal oxide and additive;
   (b) drying and calcining the mixture wherein the tantalum and niobium constituents are hydrated oxides and/or acids.

5. Method according to claim 4 wherein the additive is added as a compound selected from the group consisting of salts, hydroxides, and oxides.

6. Method according to claim 4, wherein the additive is selected from the group consisting of lithium niobate and lithium tantalate.

7. Method according to claim 6, wherein the lithium constituent is selected from the group consisting of salts, hydroxides, and oxides thereof and the niobium constituent or tantalum constituent is hydrated niobium oxide or hydrated tantalum oxide.

8. Method according to claim 4, wherein wet mixing is carried out for a period ranging from 5 minutes to 90 minutes and calcination is conducted at temperatures in the range of from 400° C. to 1,200° C. for a period ranging from 15 minutes to 6 hours.

9. Method according to claim 8, wherein the calcination is conducted at 500° C. to 1,000° C.

10. Method according to claim 8, wherein calcination is carried out at temperatures in the range of from 400° C. to 1,100° C., for a period ranging from 15 minutes to 6 hours.

11. Method according to claim 8, wherein the resulting perovskite is at least 95% pure.

12. Method according to claim 11, wherein the perovskite is more than 98% pure.

13. Method according to claim 8, wherein sintering of the perovskite is carried out at temperatures in the range of from 700° C. to 1,300° C. for from 15 minutes to 10 hours.

14. Method according to claim 13, wherein the sintering is carried out below 1,000° C.

* * * * *